United States Patent
Gogmos et al.

(10) Patent No.: US 12,384,225 B2
(45) Date of Patent: Aug. 12, 2025

(54) POWER SUPPLY MODULE FOR HEATING RADIATOR AND HEATING RADIATOR FITTED WITH SUCH A MODULE

(71) Applicant: Valeo Systemes Thermiques, Le Mesnil-Saint-Denis (FR)

(72) Inventors: Erwan Gogmos, Le Mesnil Saint Denis (FR); Yann Couapel, Le Mesnil Saint Denis (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 62 days.

(21) Appl. No.: 16/764,997

(22) PCT Filed: Dec. 10, 2018

(86) PCT No.: PCT/FR2018/053174
§ 371 (c)(1),
(2) Date: May 18, 2020

(87) PCT Pub. No.: WO2019/122584
PCT Pub. Date: Jun. 27, 2019

(65) Prior Publication Data
US 2020/0307354 A1    Oct. 1, 2020

(30) Foreign Application Priority Data
Dec. 19, 2017   (FR) ..................... 1762535

(51) Int. Cl.
B60H 1/22     (2006.01)
B60H 1/00     (2006.01)
(Continued)

(52) U.S. Cl.
CPC ......... B60H 1/2225 (2013.01); F24H 3/0429 (2013.01); H05K 1/0209 (2013.01);
(Continued)

(58) Field of Classification Search
CPC ..................... B60H 1/2225; F24H 9/2071
(Continued)

(56) References Cited

U.S. PATENT DOCUMENTS

| 8,946,599 B2 * | 2/2015 | Niederer | F24H 3/0464 |
| | | | 219/205 |
| 2002/0011484 A1 * | 1/2002 | Beetz | H05B 1/0236 |
| | | | 219/202 |
| 2012/0193339 A1 * | 8/2012 | Adachi | F24H 1/009 |
| | | | 219/202 |

FOREIGN PATENT DOCUMENTS

| CN | 1656850 A | 8/2005 |
| CN | 103797892 A | 5/2014 |

(Continued)

OTHER PUBLICATIONS

Machine Translation of EP0901311B1 (Year: 2024).*
(Continued)

*Primary Examiner* — Steven W Crabb
*Assistant Examiner* — Thomas J Ward
(74) *Attorney, Agent, or Firm* — Osha Bergman Watanabe & Burton LLP

(57) ABSTRACT

The invention relates to a heating radiator (1) comprising a power supply module (2) and a heating body (3), said power supply module (2) comprising a printed circuit board (20), a plurality of electronic switches (21) and one or more connectors (22) for connecting to an external circuit, said printed circuit board (20) comprising a first zone (200) providing an electrical connection with the heating body (3), a second zone (210) providing an electrical connection with the electronic switches (21) and a third zone (220) providing an electrical connection with the one or more connectors (22), said first, second and third zones being located side-
(Continued)

Figure 1A:
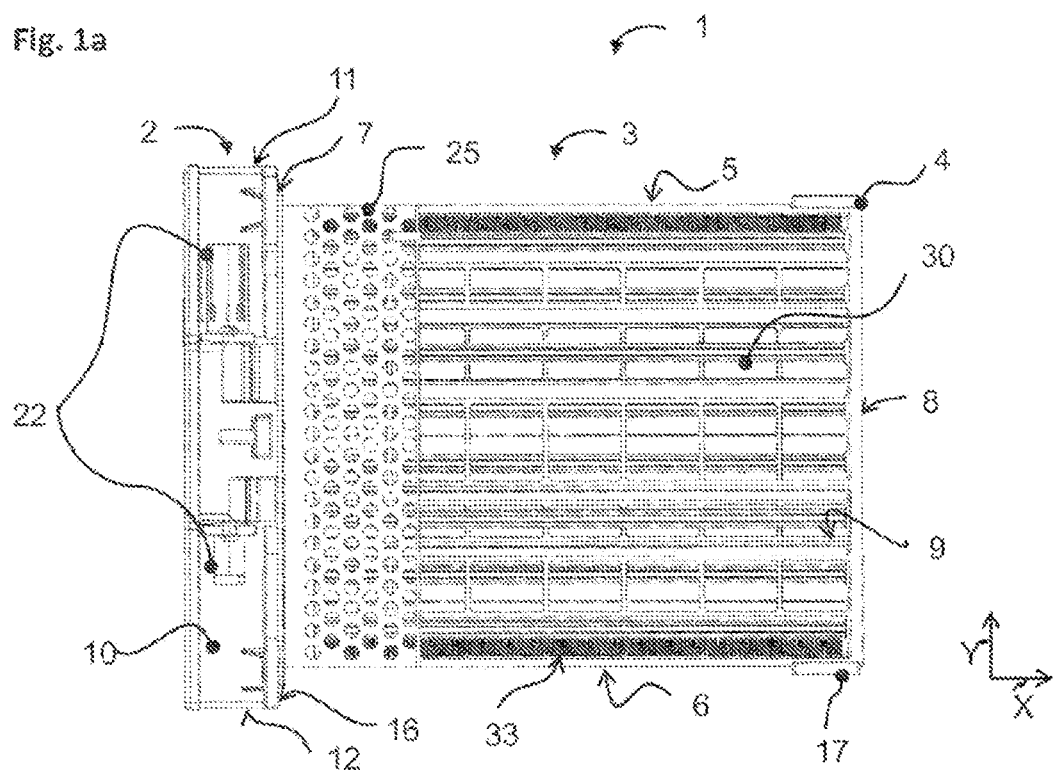

by-side in this order in a direction that is transverse to a plane in which the heating body (2) extends.

13 Claims, 5 Drawing Sheets

(51) Int. Cl.
*F24H 3/04* (2022.01)
*F24H 9/20* (2022.01)
*H05K 1/02* (2006.01)

(52) U.S. Cl.
CPC .............. *B60H 2001/00614* (2013.01); *B60H 2001/2278* (2013.01); *F28F 2210/02* (2013.01); *F28F 2210/10* (2013.01); *H05K 2201/09972* (2013.01)

(58) Field of Classification Search
USPC ......................................................... 219/534
See application file for complete search history.

(56) References Cited

FOREIGN PATENT DOCUMENTS

| DE | 102011089539 B3 | | 4/2013 |
|---|---|---|---|
| EP | 1630013 A1 | | 3/2006 |
| EP | 0901311 B1 | * | 5/2010 |
| EP | 3096587 A1 | | 11/2016 |
| KR | 20100112035 A | | 10/2010 |
| KR | 20120013558 A | | 2/2012 |
| WO | 2012130553 A1 | | 10/2012 |

OTHER PUBLICATIONS

First Office Action in corresponding Chinese Application No. 201880081074.9, dated Apr. 2, 2021 (18 pages).
International Search Report and Written Opinion in corresponding International Application No. PCT/FR2018/053174, mailed Apr. 17, 2019 (16 pages).
Second Office Action in corresponding Chinese Application No. 201880081074.9, dated Oct. 20, 2021 (25 pages).

* cited by examiner

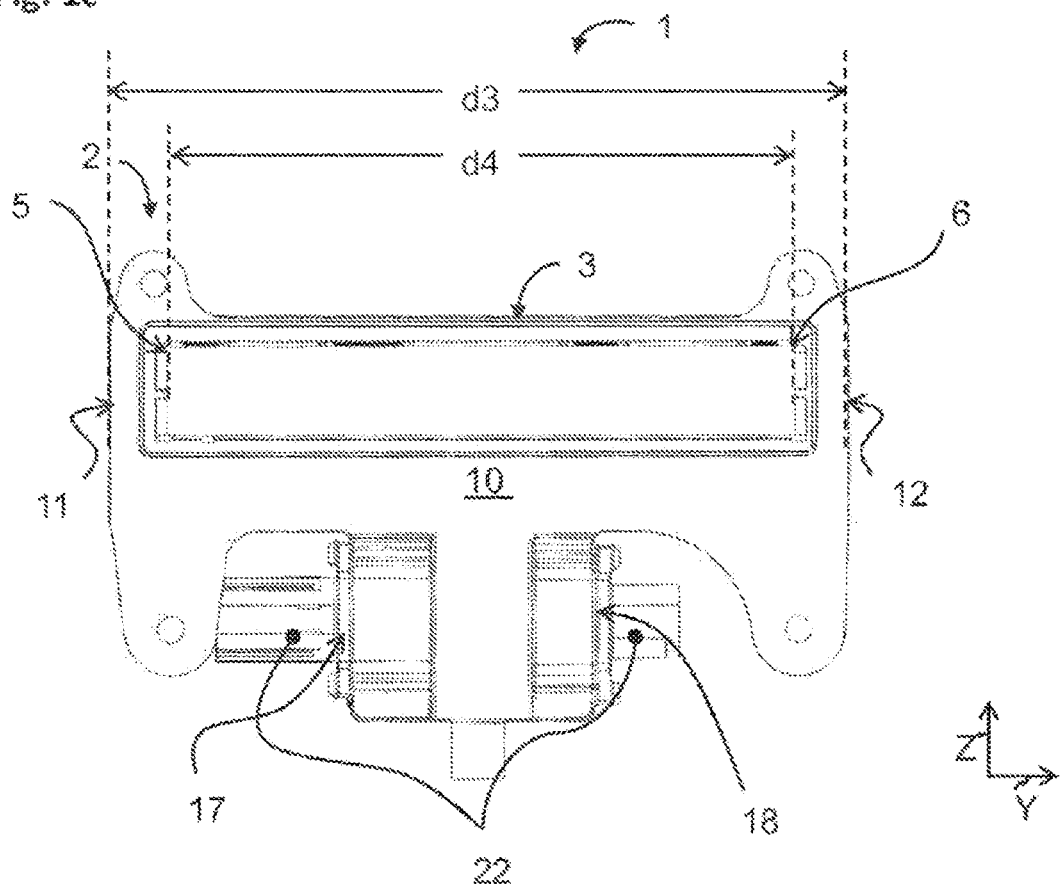

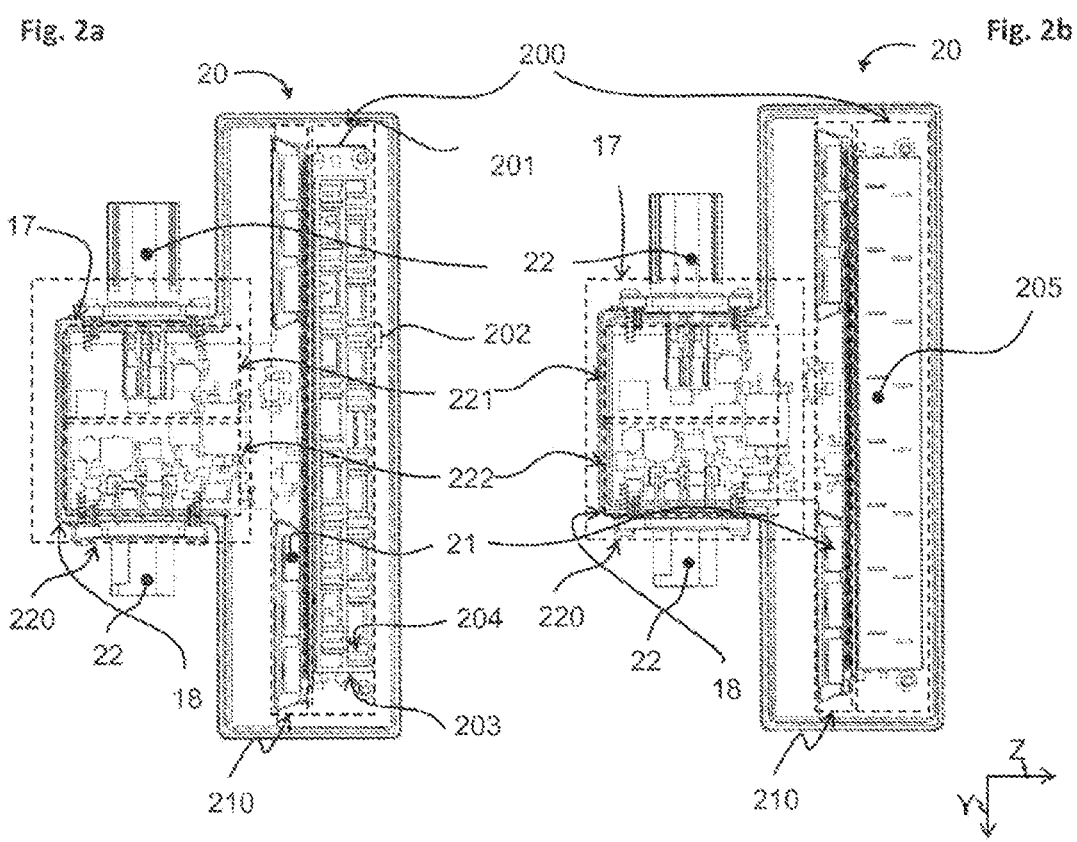

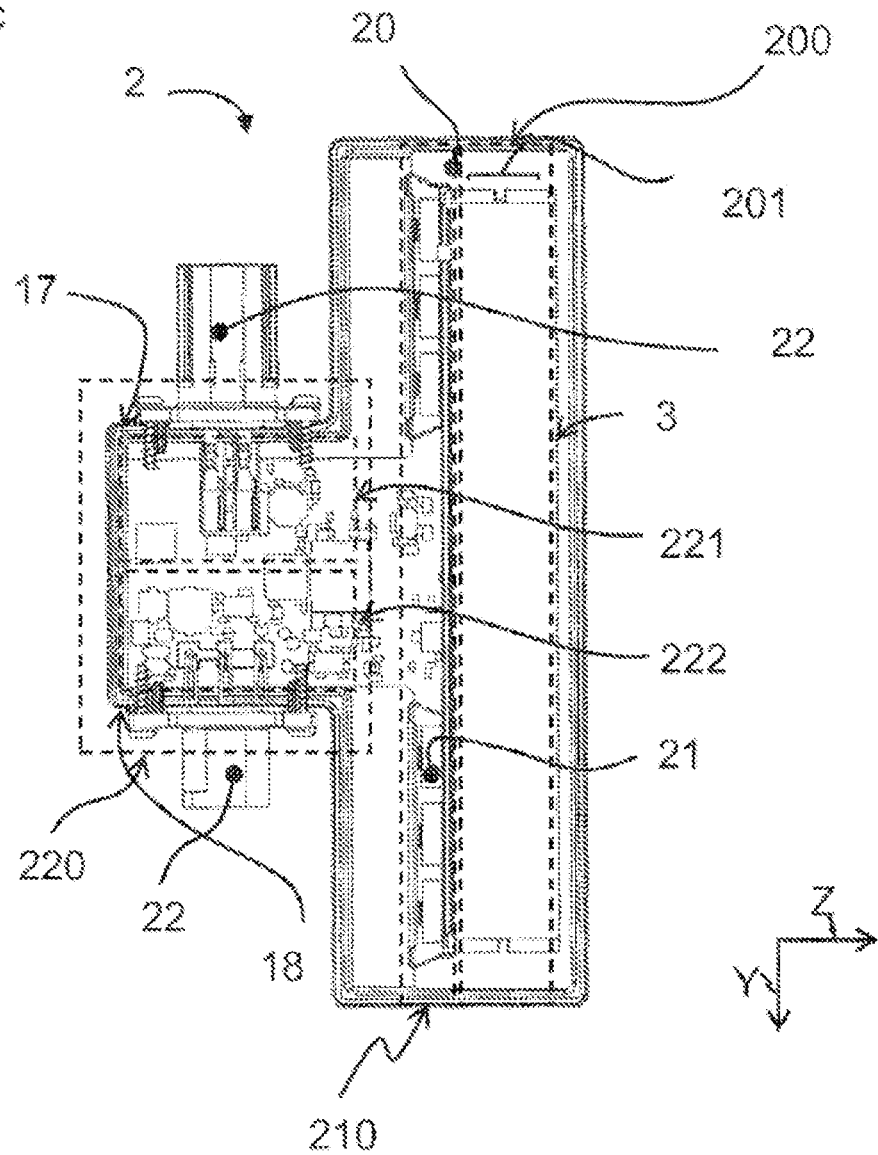

POWER SUPPLY MODULE FOR HEATING RADIATOR AND HEATING RADIATOR FITTED WITH SUCH A MODULE

FIELD OF THE INVENTION

The invention relates to a power supply module for a heating radiator and a heating radiator comprising such a power supply module. The invention is intended in particular for air-conditioning units, in particular for motor vehicles.

PRIOR ART

Heating radiators for motor vehicles, in particular electric or hybrid motor vehicles, conventionally comprise a heating body in which are installed a plurality of heating elements supplied with current from a power supply module incorporated within the heating radiator. These heating elements are capable of heating an air flow sent into the passenger compartment of the motor vehicle after passing through the heating body.

In known devices, the power supply module generally comprises a printed circuit board which extends transversely relative to the plane of extension of the heating body, adjacent to a proximal border of said heating body. When the heating radiator is incorporated within the housing located under the dashboard of a vehicle, the heating body is completely inserted into the space provided for this purpose in the housing, while the power supply module protrudes from the housing.

Conventionally, the printed circuit board is connected to one or more control elements and/or connectors to the heating body and/or to external circuits, the distribution of which varies according to different configurations. As analyzed by the applicant of the present application, these configurations must meet various constraints. First of all, they must be of limited volume, together with the volume of the heating body. They must also promote the dissipation of the heat given off by the control elements. Furthermore, they must allow a simple spatial distribution of the conductive tracks located on the printed circuit board providing the electrical connection between the electronic components used and said printed circuit board.

There remains a need for improvement in this area.

To this end, according to a first aspect, the invention provides a heating radiator comprising a power supply module and a heating body, said power supply module comprising a printed circuit board, a plurality of electronic switches and one or more connectors to an external circuit, said printed circuit board comprising a first zone providing an electrical connection with the heating body, a second zone providing an electrical connection with the electronic switches and a third zone providing an electrical connection with the one or more connectors, said first, second and third zones being located side by side in that order in a direction transverse to a plane of extension of the heating body.

In this way, a power supply module is provided in which the switches remain close to the heating body, which will facilitate the dissipation of the heat that they give off, in particular through the use of a heat sink placed in the air flow intended to pass through the heating body.

Such a power supply module also makes it possible to limit the volume by placing its different zones side by side in the same direction. A substantially planar configuration is thus obtained in this way.

By "substantially planar", what is meant is that the power supply module exhibits a low thickness in the plane of extension of the heating body, and that it extends in a plane that is transverse, in particular perpendicular, to said heating body. In other words, the power supply module has a small dimension along a longitudinal axis X of the plane of extension of the heating body, a dimension that is substantially similar to the heating body along an axis Y transverse to the longitudinal axis X in the plane of extension of the heating body and a dimension that is suitable for the dimensioning of the first, second and third zones side by side along an axis Z transverse to the axes X and Y.

In addition, the distribution of the elements of the power supply module into distinct zones, which are moreover positioned side by side, simplifies the spatial distribution of the tracks of the printed circuit board.

According to various features of the invention which may be taken together or separately:

- said third zone extends in a median zone so as to give the printed circuit board a T-shaped configuration;
- said third zone forms a longitudinal branch of the T and the first and second zones form a transverse branch of the T;
- the one or more connectors extend from lateral edges of the longitudinal branch of the T in a direction parallel to the transverse border of the T;
- the one or more connectors do not extend beyond lateral edges of a housing of said power supply module, said housing accommodating said printed circuit board;
- said heating body comprises heating elements;
- said heating elements comprise, at their ends, electrodes opening onto the first zone;
- said heating radiator comprises a connector member for connecting the electrodes to said printed circuit board;
- said connector member is secured to said first zone;
- the connector member comprises a frame and connector elements;
- said frame is secured to said first zone;
- said connector elements make contact with said electrodes, which connector elements are connected to the printed circuit board and overmolded into said frame;
- said member is surmounted by an electrically insulating plate;
- the electronic switches are aligned in a direction parallel to a direction of extension of said frame;
- the electronic switches extend on either side of the third zone;
- said heating radiator comprises a heat sink extending parallel to the plane of extension of the heating body so as to allow the heat given off by said electronic switches to be dissipated by an air flow passing through the heating body;
- a first of the connectors is a low-voltage connector;
- the other, second of the connectors is a high-voltage connector;
- the third zone comprises a zone of low-voltage components, grouped together and connected to the low-voltage connector;
- the third zone comprises a zone of high-voltage components, grouped together and connected to the high-voltage connector.

According to another aspect, the invention also relates to the power supply module for the heating radiator such as described above.

PRESENTATION OF THE FIGURES

Figure 1B:
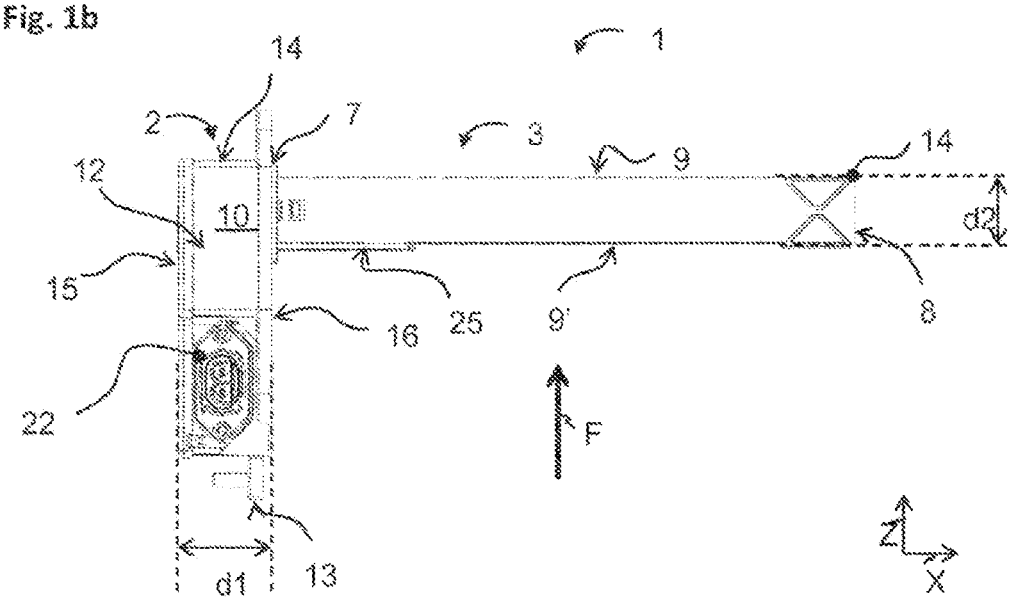
Figure 3A:
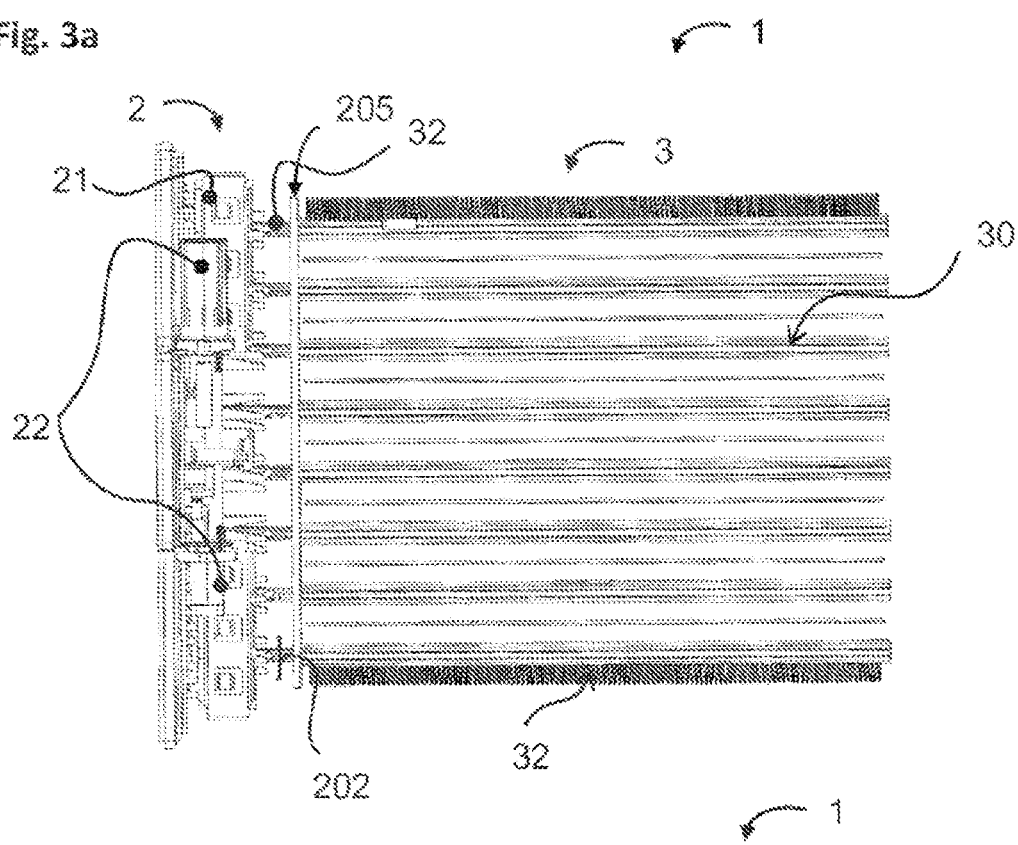
Figure 3B:
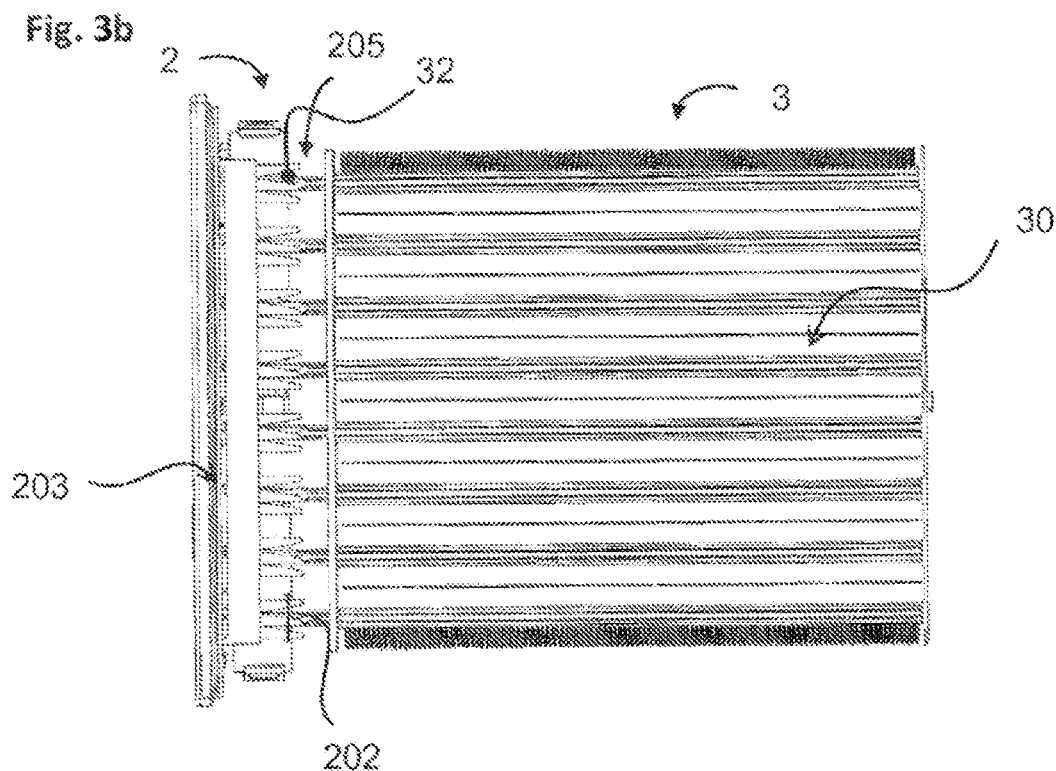

Other subjects, features and advantages of the invention will become more clearly apparent from the description which follows, provided with reference to the appended figures, in which:

FIG. 1a schematically illustrates, from the front, a heating radiator according to one embodiment of the invention;

FIG. 1b schematically illustrates, from above, the heating radiator of FIG. 1;

FIG. 1c schematically illustrates, from the side, the heating radiator of FIG. 1;

FIG. 2a schematically illustrates, from the side, a power supply module for the radiator of FIG. 1, the module being illustrated without part of its housing in order for some of the components that it contains to be seen;

FIGS. 2b and 2c schematically illustrate, from the side, the module of FIG. 2a with, in addition, an electrically insulating plate (FIG. 2b) and the heating body (FIG. 2c);

FIGS. 3a and 3b schematically illustrate the heating radiator of FIG. 1, viewed from the front (FIG. 3a) and from the back (FIG. 3b), only certain elements of the body and of the power supply module being shown.

DETAILED DESCRIPTION

With reference to FIGS. 1a to 1c, the invention relates to a heating radiator 1 comprising a power supply module 2 and a heating body 3, intended for an air flow F to pass therethrough.

It is, for example, what is known as a high-voltage heating radiator, i.e. one that is intended to be supplied with a current greater than 60 V, in particular between 60 and 1000 V, more particularly between 180 and 600 V, and/or one that allows a power higher than 2 kW, in particular between 2 kW and 10 kW, to be given off. Thus, in the case of a heating radiator for a motor vehicle, the air flow F may be heated by passing through the heating body 3 so as to increase the temperature in the passenger compartment of the vehicle.

As is more clearly apparent from FIG. 1a, said heating body 3 extends in a plane of extension, called the plane of extension of the heating body, which comprises a longitudinal axis X and a transverse axis Y, said transverse axis Y being orthogonal to the axis X. Said heating body 3 has in this case a substantially parallelepipedal configuration, extending in said plane of extension of the heating body. It is intended to be positioned transverse to the air flow F to be heated. More specifically, said air flow F is intended to be oriented perpendicular to said heating body 3, i.e. perpendicular to the plane of FIG. 1a.

Said heating body 3 comprises heating elements (not shown). The heating elements are for example PTC (positive temperature coefficient) effect resistors. Said one or more heating elements are located inside one or more tubes or housings 30 of said heating body 3 in order for said one or more heating elements to be electrically insulated from the outside.

The housings 30 form, together with the heating elements, heating units. Said heating units are selectively supplied with current. This is understood to mean that each heating unit is supplied with current independently of the other units and therefore a current that is different, in particular in terms of its intensity, from the current flowing through the other heating units may flow therethrough. The value of the current involved in this case is in particular the value of the average current or of the effective current.

Said heating elements are electrically connected in parallel, in particular using electrodes 32 (visible in FIG. 3a) located at their ends. Preferably, said heating elements are distributed regularly along said housings 30.

The heating body 3 may also include heat sinks 33, for example fins, in thermal contact with the heating elements. The heat sinks 33 are positioned, in particular, between said housings 30.

Said heating body 3 comprises a frame 4, in particular made of plastic material, accommodating said heating units. Said frame 4 comprises two opposite lateral edges 5 and 6, and a proximal edge 7 and an opposite distal edge 8, said proximal edge 7 and said distal edge 8 being joined to the lateral edges 5 and 6, for example by their ends. Said frame 4 is preferably provided with reinforcements extending transversely between the two lateral edges 5 and 6 of the frame. The one or more housings 30 extend longitudinally from the proximal edge 7 to the distal edge 8. The frame 4 is fixed to the power supply module 2, and in particular to a housing 10 of said power supply module 2.

Said housing 10 comprises two opposite lateral edges 11 and 12, and a proximal edge 16, located opposite the proximal edge 7 of the heating body 3, and an opposite distal edge 15. Said proximal edge 16 and said distal edge 15 of the power supply module 2 extend transversely, in particular perpendicularly, to the plane of extension of the heating body.

As is more clearly apparent from FIG. 1b, the proximal edge 16 and the distal edge 15 of said power supply module 2 are separated by a distance d1. Said distance d1 is the smallest dimension of the power supply module 2, i.e. said distance d1 corresponds to the thickness of said power supply module 2. By way of comparison, the distance d1 is substantially equivalent to a distance d2 separating a first large face 9 and a second large face 9' of the heating body 3, said distance d2 being the thickness of the heating body 2. In other words, and with reference to FIG. 1a, the power supply module 2 therefore has a small dimension in the plane of extension of the heating body.

In FIG. 1c, said power supply module 2 may be seen in a plane of extension, called the plane of extension of the power supply module. Said plane of extension of the power supply module comprises the longitudinal axis X and a transverse axis Z orthogonal to the axis X and to the axis Y. In other words, said plane of extension of the power supply module extends transversely to said plane of extension of the heating body.

As illustrated, again, in FIG. 1c, the opposite lateral edges 11 and 12 of the power supply module 2 are separated by a distance d3, corresponding to the height of the power supply module 2, while the lateral edges 5 and 6 of the heating body 3 are separated by a distance d4, said distance d4 corresponding to the height of the heating body 3. Said distances d3 and d4 preferentially differ by less than 20%, and even more preferentially by less than 10%. In other words, the height of the power supply module 2 is equivalent to that of the heating body 3.

With reference to FIGS. 2a to 2c, the heating radiator 1 according to the invention is illustrated from the front without the heating body 2 (FIGS. 2a and 2b) and with the heating body 2 (FIG. 2c). As illustrated in FIG. 2c, the heating radiator 1 corresponds to the heating radiator of FIG. 1c without part of the housing 10 of the power supply module 2 (only a cover of said housing remaining).

The housing 10 of the power supply module 2 accommodates a printed circuit board 20 extending transversely, in particular perpendicularly, to the plane of extension of the heating body. By printed circuit board 20, what is meant is a board for bearing and electrically reciprocally connecting a set of electronic components. To this end, the printed circuit board 20 includes a set of conductive tracks for connecting said electronic components. Said printed circuit board 20 occupies a suitable area in the housing 10, i.e. its entire area is included in the housing 10, so that it is protected from the outside environment. In this case, it follows the contours.

According to the invention, said printed circuit board 20 comprises a first zone 200 providing an electrical connection with the heating body 3, a second zone 210 providing an electrical connection with electronic switches 21 and a third zone 220 providing an electrical connection with one or more connectors 22 to one or more external circuits, said first, second and third zones being located side by side in that order in a direction that is transverse, in particular perpendicular, to a plane of extension of the heating body 2. In other words, the first zone 200 is adjacent to the second zone 210, the second zone 210 is adjacent to the third zone 220, while the first zone 200 and the third zone 220 are not adjoining. Expressed differently still, the second zone 210 is interposed between said first and third zones.

By arranging said first, second and third zones side by side, the printed circuit board 20 is partitioned, i.e. said printed circuit board 20 is divided into a plurality of zones, which moreover are zones having distinct functionalities. This makes it possible to improve the distribution of the conductive tracks over the printed circuit board 20 by avoiding overlapping between tracks having different attributes.

Furthermore, the positioning of said first, second and third zones described above in one and the same plane therefore allows the power supply module 2 to have a substantially planar configuration in the plane of extension of the heating body and its volume to be limited, so that when the heating radiator 1 is inserted into the housing provided for this purpose under the dashboard, the power supply module 2 extends beyond the housing only by the distance d1 (visible in FIG. 1b).

More precisely, the first zone 200, delimited by the dashed rectangle situated on the right in FIGS. 2a to 2c, is located facing the heating body 3. Specifically, as is more clearly apparent from FIG. 2c, said first zone 200 is masked by the heating body 3, such that it faces the proximal edge 7 of said heating body 3. In such a configuration, the electrodes 32 (visible in FIG. 3a) located at the ends of the heating elements open into the housing 10 directly facing the first zone 200.

The power supply module 2 advantageously comprises a connector member 201 allowing said electrodes 32 to be connected to the printed circuit board 20. Said connector member 201 is secured to said first zone 200, i.e. it extends entirely within the first zone 200 and is fixed to said first zone 200.

Advantageously, said connector member 201 comprises a frame 203 and connector elements 204. The frame 203 is secured to the first zone 200 and extends perpendicularly to the printed circuit board 20. Said frame 203 (visible from the side in FIG. 3b) corresponds to the contour of said connector member 201 and allows the connector elements 204 to be positioned on the printed circuit board 20. Said connector elements 204 are connected to the printed circuit board 20 and overmolded into said frame 203. By "overmolded", what is meant is that said connector elements 204 are molded into the frame 203, said frame being molded itself. Said connector elements 204 are located facing the electrodes 32, so as to make direct contact with the electrodes 32 emerging at the first zone 200.

As illustrated in FIG. 2b, the connector member 201 is advantageously surmounted by an electrically insulating plate 205, such that said plate 205 is facing the first zone 200 in the plane of extension of the heating body 3.

In the second zone 210, delimited by the center dashed rectangle in FIGS. 2a to 2c, the electronic switches 21 are aligned in a direction parallel to a direction of extension of said frame 203. In other words, the electronic switches 21 are distributed along the connector member 201 and parallel to said connector member 201.

The electronic switches 21 within the meaning of the invention are power electronic components allowing the current flowing through each heating unit to be controlled independently on the basis of a control signal. They are therefore controlled switches. Preferably, the electronic switches 21 are insulated-gate bipolar transistors (IGBTs) or metal-oxide-semiconductor field-effect transistors (MOSFETs). Such switches are particularly suitable when the power supplied to the heating radiators is high. The examples mentioned above are non-limiting and other types of electronic switches may be envisaged for supplying current to the heating body 3.

When the heating radiator 1 is supplied with voltage, the electronic switches 21 heat up and then give off heat. This heat must therefore be dissipated in order to prevent the power supply module 2 from overheating.

By virtue of the arrangement of the zones according to the invention, the power supply module 2 is configured such that the electronic switches 21 remain close to the heating body 3. Specifically, as illustrated in FIG. 2c, the electronic switches 21 are advantageously placed in the immediate vicinity of the heating body 3. Such a configuration facilitates the dissipation of the heat given off by said electronic switches 21, in particular through the use of a thermal conductor placed in the air flow F intended to pass through the heating body.

To this end, the heating radiator 1 comprises a heat sink 25 that extends parallel to the plane of extension of the heating body 3. The heat sink 25 makes direct contact with the electronic switches 21, which allows it to exchange heat with said electronic switches 21 by conduction, then to dissipate the heat given off by said electronic switches 21 via the air flow F passing through the heating body 3. Thus, advantageously, the heat generated by the electronic switches 21 and dissipated in the heating body 3 by means of the heat sink 25 may contribute to the heating of the air flow F passing through the heating body 3.

As illustrated in the dashed rectangle on the left in FIGS. 2a to 2c, the third zone 220 preferably extends in a median zone, so as to give the printed circuit board 20 a T-shaped configuration. More precisely, the first and second zones 200, 210 form a transverse branch of the T, while said third zone 220 forms a longitudinal branch of the T. Additionally, it will be understood that the electronic switches 21, located in the second zone 210, adjacent to said third zone 220, extend on either side of said third zone 220, i.e. said switches 21 extend from the lateral edges of the longitudinal branch of the T in a direction parallel to the transverse branch of the T.

As apparent from FIG. 2a, the third zone 220 covers an area which extends between lateral edges 17 and 18 of the longitudinal branch of the T.

Advantageously, the one or more connectors 22 to one or more external circuits of the power supply module extend from lateral edges 17, 18 of the longitudinal branch of the T in a direction parallel to the transverse border of the T. In other words, the one or more connectors 22 extend parallel to the transverse branch of the T on each side of the longitudinal branch of the T. Preferably, the one or more connectors 22 do not extend beyond the lateral edges 11, 12 of the housing 10 of said power supply module 2. This is facilitated in particular by the median position of the third zone 220 and allows the height d3 of the power supply module 2 to be kept limited.

Advantageously, a first connector 22a of said connectors is a low-voltage connector and a second connector 22b of said connectors is a high-voltage connector. To this end, as illustrated in FIGS. 2a to 2c, said third zone 220 comprises a zone 221 of low-voltage components, grouped together and connected to the low-voltage connector 22a, and a zone 222 of high-voltage components, grouped together and connected to the high-voltage connector 22b. This advantageously makes it possible to improve the spatial distribution of the components in said third zone 220 according to their functionalities.

An optimized heating radiator 1 is thus obtained, grouping the functionalities of the power supply module 2 into distinct zones that are distributed appropriately, using the heat given off by the components of said power supply module 2 in the air flow passing through the heating body 3 and extending little out of the housing located under the dashboard of a vehicle.

The invention also relates to the power supply module 2 for the heating radiator according to one of the preceding claims.

The invention claimed is:

1. A heating radiator comprising:
a power supply module; and
a heating body configured to heat an air flow by passing the air flow in a first direction through the heating body;
wherein the power supply module comprises a single printed circuit board, a plurality of electronic switches and a plurality of connectors to an external circuit;
wherein the single printed circuit board comprises a first zone providing a first electrical connection with the heating body, a second zone providing a second electrical connection with the plurality of electronic switches, and a third zone providing a third electrical connection with the plurality of connectors;
wherein the first, second, and third zones are located on one face of the single printed circuit board, side by side in that order in a second direction transverse to a plane of extension of the heating body;
wherein the plurality of electronic switches is placed in an immediate vicinity of the heating body such that heat given off by the plurality of electronic switches directly dissipates in the first direction of the air flow through the heating body to further heat the air flow;
wherein the third zone extends in a median zone so as to give the single printed circuit board a T-shaped configuration, the third zone forming a longitudinal branch of the T-shaped configuration and the first and second zones forming a transverse branch of the T-shaped configuration;
wherein the plurality of connectors extend from lateral edges of the longitudinal branch of the T-shaped configuration in a direction parallel to a transverse border of the T-shaped configuration.

2. The heating radiator as claimed in claim 1, wherein the plurality of connectors do not extend beyond the lateral edges of a housing of the power supply module, the housing accommodating the single printed circuit board.

3. The heating radiator as claimed in claim 1, wherein the heating body comprises heating elements, the heating elements comprising, at their ends, electrodes opening onto the first zone.

4. The heating radiator as claimed in claim 3, comprising a connector member for connecting the electrodes to the single printed circuit board, the connector member being secured to the first zone.

5. The heating radiator as claimed in claim 4, wherein the connector member comprises a frame and connector elements, the frame being secured to the first zone, the connector elements making contact with the electrodes, which connector elements are connected to the single printed circuit board and overmolded into the frame.

6. The heating radiator as claimed in claim 5, wherein the plurality of electronic switches are aligned in a third direction parallel to a fourth direction of extension of the frame.

7. The heating radiator as claimed in claim 4, wherein the connector member is surmounted by an electrically insulating plate.

8. The heating radiator as claimed in claim 1, wherein the plurality of electronic switches extend on either side of the third zone.

9. The heating radiator as claimed in claim 1, further comprising a heat sink extending parallel to the plane of extension of the heating body so as to allow the heat given off by the plurality of electronic switches to be dissipated by the air flow passing through the heating body.

10. The heating radiator as claimed in claim 1, wherein a first connector of the plurality of connectors is a low-voltage connector and a second connector of the plurality of connectors is a high-voltage connector.

11. The heating radiator as claimed in claim 10, wherein the third zone comprises a zone of low-voltage components, grouped together and connected to the low-voltage connector, and a zone of high-voltage components, grouped together and connected to the high-voltage connector.

12. A power supply module for a heating radiator, the power supply module comprising:
a single printed circuit board;
a plurality of electronic switches; and
a plurality of connectors to an external circuit;
wherein the single printed circuit board comprises a first zone providing a first electrical connection with a heating body of the heating radiator, a second zone providing second electrical connection with the plurality of electronic switches, and a third zone providing third electrical connection with the plurality of connectors;
wherein the heating body is configured to heat an air flow by passing the air flow in a first direction through the heating body;
wherein the first, second, and third zones are located on one face of the single printed circuit board, side by side in that order in a second direction transverse to a plane of extension of the heating body;
wherein the plurality of electronic switches is placed in an immediate vicinity of the heating body such that heat given off by the plurality of electronic switches directly dissipates in the first direction of the air flow through the heating body to further heat the air flow;
wherein the third zone extends in a median zone so as to give the single printed circuit board a T-shaped configuration, the third zone forming a longitudinal branch of the T-shaped configuration and the first and second zones forming a transverse branch of the T-shaped configuration;

wherein the plurality of connectors extend from lateral edges of the longitudinal branch of the T-shaped configuration in a direction parallel to a transverse border of the T-shaped configuration.

13. A heating radiator comprising:
a power supply module; and
a heating body configured to heat an air flow by passing the air flow in a first direction through the heating body;
wherein the power supply module comprises a printed circuit board, a plurality of electronic switches and a plurality of connectors to an external circuit;
wherein the printed circuit board comprises a first zone providing a first electrical connection with the heating body, a second zone providing second electrical connection with the plurality of electronic switches, and a third zone providing a third electrical connection with the plurality of connectors;
wherein the first, second, and third zones are located on one face of the printed circuit board, side by side in that order in a second direction transverse to a plane of extension of the heating body;
wherein the plurality of electronic switches is placed in an immediate vicinity of the heating body such that heat given off by the plurality of electronic switches directly dissipates in the first direction of the air flow through the heating body to further heat the air flow;
wherein the third zone extends in a median zone so as to give the printed circuit board a T-shaped configuration, the third zone forming a longitudinal branch of the T-shaped configuration and the first and second zones forming a transverse branch of the T-shaped configuration;
wherein the plurality of connectors extend from lateral edges of the longitudinal branch of the T-shaped configuration in a direction parallel to a transverse border of the T-shaped configuration;
wherein the plurality of connectors are disposed within lateral edges of a housing of the power supply module, the housing accommodating the printed circuit board; and
wherein a first connector of the plurality of connectors is a low-voltage connector and a second connector of the plurality of connectors is a high-voltage connector.

* * * * *